United States Patent [19]

Thomas et al.

[11] Patent Number: 4,571,366

[45] Date of Patent: Feb. 18, 1986

[54] PROCESS FOR FORMING A DOPED OXIDE FILM AND DOPED SEMICONDUCTOR

[75] Inventors: Ian M. Thomas, Temperance, Mich.; James J. Tillman, Toledo, Ohio

[73] Assignee: Owens-Illinois, Inc., Toledo, Ohio

[21] Appl. No.: 347,834

[22] Filed: Feb. 11, 1982

[51] Int. Cl.$^4$ .................. H01L 23/18; B32B 9/04
[52] U.S. Cl. .................. 428/446; 148/188; 427/85; 428/447; 428/696; 428/704
[58] Field of Search ............ 428/447, 446, 696, 704; 148/188; 427/85

[56] References Cited

U.S. PATENT DOCUMENTS

| | | | |
|---|---|---|---|
| 3,084,079 | 4/1963 | Harrington | 148/188 |
| 3,514,348 | 5/1970 | Yu | 148/186 |
| 3,615,943 | 10/1971 | Genser | 148/188 |
| 3,658,584 | 4/1972 | Schmidt | 148/188 X |
| 3,660,156 | 5/1972 | Schmidt | 148/188 X |
| 3,789,023 | 1/1974 | Ritchie | 148/188 X |
| 3,798,081 | 3/1974 | Beyer | 148/188 |
| 3,834,939 | 9/1974 | Beyer | 148/186 X |
| 3,837,873 | 9/1974 | Pollack et al. | 148/186 X |
| 3,915,766 | 10/1975 | Pollack et al. | 148/188 |
| 3,928,225 | 12/1975 | Schafer | 148/188 X |
| 4,152,286 | 5/1979 | Crossen et al. | 148/188 X |
| 4,236,948 | 12/1980 | Seibold et al. | 148/188 |
| 4,243,427 | 1/1981 | DiBugnara | 148/22 X |
| 4,251,285 | 2/1981 | Yoldas et al. | 148/188 X |

Primary Examiner—Ellis P. Robinson
Attorney, Agent, or Firm—John R. Nelson

[57] ABSTRACT

A process for forming a doped oxide film and a doped semiconductor suitable for electronic applications wherein a silicon tetraalkoxide is reacted with a limited amount of water to produce a low molecular weight, soluble polyorganosiloxane. The polyorganosiloxane is subsequently admixed with a soluble dopant element compound to form a homogeneous, polyorganosiloxane-dopant compound solution. The solution is coated onto a semiconductor wafer substrate material and heated to produce an impurity doped semiconductor wafer suitable for electronic application.

10 Claims, 1 Drawing Figure

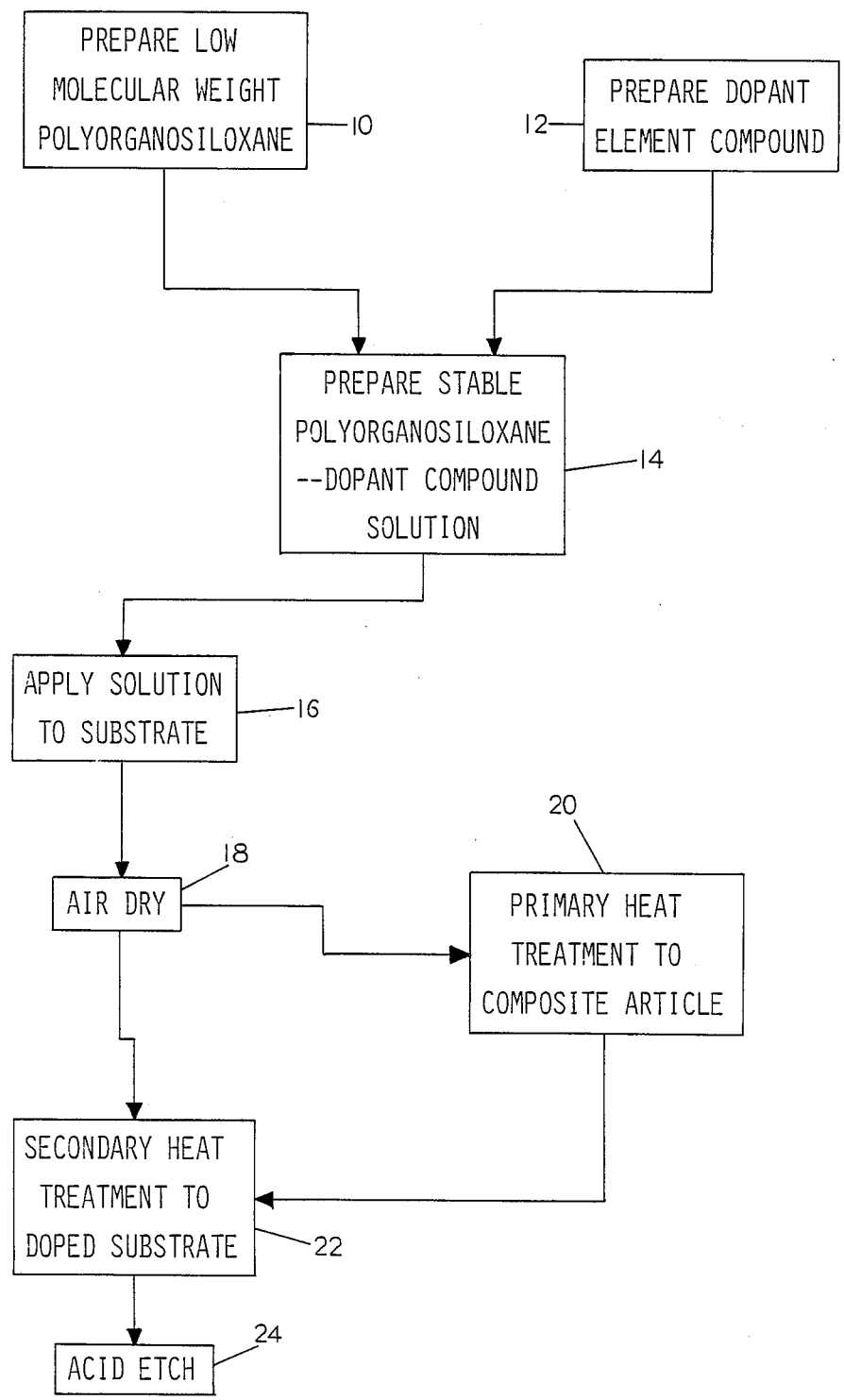

PROCESS FOR FORMING A DOPED OXIDE FILM AND DOPED SEMICONDUCTOR

TECHNICAL FIELD

The present invention relates to the fabrication of semiconductor devices and more particularly to methods and compositions for the solid-state diffusion of conductive-type impurities from a dopant film into a semiconductor wafer or other substrate material.

BACKGROUND ART

The use of doped oxide films as sources of impurities for solid-state diffusion in the fabrication of semiconductor devices is well established in the electronics art. Many attempts have been made in the past to provide uniform dopant ladened films which may be used to transfer N-type and P-type impurities into a semiconductor wafer material.

One approach has been to form a doped glassy layer on a semiconductor wafer by using silicone polymers which are admixed with dopant sources. The mixture of silicone polymer and dopant is coated onto a wafer and heated to produce a glassy dopant laden film. Upon further heating the dopant is diffused, in the solid state, from the glassy film into the semiconductor wafer. Such silicone based coating methods are examplified in U.S. Pat. Nos. 3,084,079; 3,798,081 and 3,834,939. Such methods which rely on silicone polymer matrices suffer from several shortcomings. The silicon-carbon bond in the silicone polymer is not subject to hydrolytic degradation. Rather, such a bond must be thermally degraded in the presence of oxygen, at high temperatures. Circumstances exist wherein high temperature degradation of the polymer matrix containing the dopant are not advisable. Further, silicone polymers can cause significant carbonaceous residue deposition upon thermal degradation which is not precisely controlled. Such carbonaceous residue buildup adversely affects the uniformity of semiconductor doping upon use of such silicone polymers.

Another approach to semiconductor doping is represented by U.S. Pat. Nos. 3,615,943; 3,837,873; 3,915,766; 3,928,225; and 4,152,286. Each of these patents represents a method of semiconductor doping wherein a silicon tetra-alkoxide is converted via acetic anhydride (or a lactic acid residue) to a mixed silicon acetate alkoxide. Such conversion eliminates the problem of premature volatilization of silicon material prior to conversion to the glass since silicon alkoxides are volatile while silicon acetates are less volatile. The mixed silicate alkoxide is combined with a dopant source. Subsequently, the mixed alkoxide and dopant source are heated to degrade the mixed alkoxide silicate into a silica based glass with dopant contained therein. Such methods also suffer from the adversities well known when organic components (such as acetate and lactate residues) are thermally degraded as described above. Methods employing silicon acetate alkoxide material do exhibit the advantage of reduced volatility of the silicate upon initial heating to form a glassy matrix.

Other attempts to provide dopant sources for semiconductor wafer uses are disclosed in U.S. Pat. Nos. 3,789,023 and 4,243,427. U.S. Pat. No. 3,789,023 discloses a liquid diffusion dopant source for semiconductor doping involving dissolving dopants in an aqueous-alcoholic solution by refluxing the starting materials. Subsequently, to the refluxed material are added alcohols, an ethyl acetate and tetraethylorthosilicate.

U.S. Pat. No. 4,243,427 discloses a mixed solution approach to dopant source provision. The patent discloses a coating composition formed by heating monoaluminum phosphate; adding methyl alcohol to the hot solution; cooling the solution and subsequently mixing tetraethylorthosilicate therewith. The solutions must be used rapidly once mixed due to the inherent instability of the resultant two component solution.

The present invention provides a process and composition for semiconductor wafer doping which provides an extremely uniform dopant film or coating which is derived from very stable solutions of starting material. Further the present invention provides a liquid dopant source which is well suited to spin-coating applications and is maintained in the stable solution phase during all steps of the process, up to actual heating of the semiconductor wafer. No carbonaceous residues or nonuniformity of doping problems are experienced.

SUMMARY OF THE INVENTION

An object of the present invention is to provide an improved dopant coating process for semiconductor wafer doping.

Another object of the invention is to provide an extremely uniform dopant laden layer, or film, which is not adversely affected prior to deposition on the wafer by solution instability or post deposition by non-uniform dopant compound distribution.

Still another advantage of the present invention is in the use of an organic solvent soluble dopant element compound in solution with a low molecular weight polyorganosiloxane which solution forms a glassy dopant source matrix for semiconductor wafer doping.

These and other advantages of the invention are realized by a process for semiconductor doping which comprises combining a silicon tetra-alkoxide with less than a stoichiometric amount of water, in the presence of an acid hydrolysis catalyst, to form a solution of a soluble low molecular weight polyorganosiloxane or so-called siloxane oligomer. The siloxane oligomer is subsequently admixed with a dopant element compound to form a homogeneous solution of the oligomer and dopant element compound. The solution of oligomer and dopant element compound is spin-coated onto a semiconductor wafer substrate material to form a dopant element compound laden film on the wafer. The wafer is subsequently heated at a relatively low temperature to form a glassy dopant laden matrix upon the wafer to produce a glassy matrix-wafer composite article. The glassy matrix is composed of polymerized oligomer with evenly distributed dopant element compound contained in the glassy matrix. Subsequently, the composite article is heated at elevated temperatures to form a doped semiconductor wafer which is subsequently acid etched to remove the glassy residue to produce an impurity doped semiconductor wafer material.

BRIEF DESCRIPTION OF THE DRAWINGS

The details of the invention will be described in the accompanying specification in view of the drawings, in which:

FIG. 1 is a schematic representation of the process of the present invention.

DESCRIPTION OF THE INVENTION

In attaining the objects and advantages of the present invention, there is provided a process for forming a semiconductor doping film on a semiconductor substrate wafer material which comprises combining a silicon tetra-alkoxide with less than a stoichiometric amount of water, in the presence of an acid hydrolysis catalyst, to form a solution of a soluble low molecular weight polyorganosiloxane, or so-called oligomer. A solution of dopant element compound, in an anhydrous organic solvent, is prepared in which the solvent is non-reactive to the siloxane oligomer solution. The siloxane oligomer must also be soluble in the selected anhydrous organic solvent.

The siloxane oligomer is admixed with the solution of dopant element compound to form a new, stable solution of oligomer-dopant element compound or a so-called oligomer-dopant solution. The oligomer-dopant solution is coated or otherwise applied to a semiconductor wafer substrate material to form a coated wafer. The coated wafer may be air dried to form a stable composite article. The composite article comprises a first polyorganosiloxane coating layer in intimate composite contact with a second substrate material wafer layer. The first layer is composed of polyorganosiloxane including the dopant element compound uniformly distributed in the interstices of the polyorganosiloxane. The composite article is stable under normal circumstances and can be stored until needed for further processing or immediately processed.

The oligomer-dopant element compound composite article is subjected to a primary heat treatment wherein the wafer and coating are heated to about 300°–600° C. to form a glassy dopant laden matrix upon the wafer. After the primary heat treatment, the glass-wafer composite article may be stored until required or processed immediately to a secondary heat treatment. In the secondary heat treatment, the glass coated wafer is heated at an elevated temperature to about 1000°–1250° C. to effect semiconductor doping. If desired, the coated wafer may be heated directly from room temperature to the doping temperature (1000°–1250° C.) without an intermediate primary heat treatment step.

Subsequently, the glassy matrix on the wafer is acid etched to remove the glassy residue to yield a doped semiconductor suitable for electronic applications.

As used herein, the phrase silicon tetra-alkoxide is defined as a compound of the formula $SiX_4$ wherein X is OR wherein R is either an alkyl group of 1 to 6 carbon atoms or an alkoxy alkyl of the formula $R_1O(C_2H_4)$— wherein $R_1$ is an alkyl group of 1 to 6 carbon atoms.

As used herein, the phrase dopant element compound is defined as a compound of the formula $M_aZ_b$ wherein M is an element of Group III or Group V, wherein a and b are integers, and Z is a compound forming ion which when combined with M forms an anhydrous organic solvent soluble compound which forms a glass forming oxide on heating.

In practicing the process of the present invention for forming dopant laden oxide films on semiconductor wafer substrate materials, a siloxane oligomer solution is prepared as illustrated at Stage 10 of FIG. 1. The oligomer is prepared by reacting a silicon tetra-alkoxide with a less than stoichiometric amount of water in the presence of an acid hydrolysis catalyst in an anhydrous organic solvent. The reactions illustrating the formation of the siloxane oligomer are as follows:

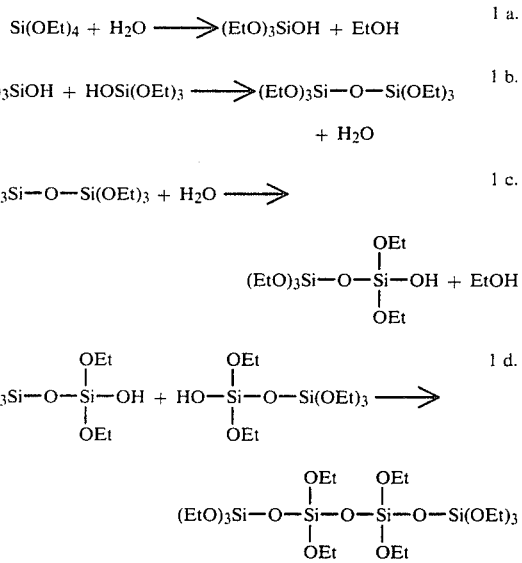

wherein: Et is ethyl

As used herein, the phrase anhydrous organic solvent is defined as a low molecular weight liquid organic material substantially free of water prior to forming the reaction mixture and which will dissolve the silicon tetra-alkoxide, the oligomer and the dopant element compound to form a homogeneous solutions.

In the preferred embodiment of the invention the silicon tetra-alkoxide is a tetraethylsilicate monomer which is reacted with two moles of water per mole of silicate monomer. The reaction can take place at room temperature, or at slightly elevated temperatures for more rapid solution formation, in the presence of an anhydrous organic solvent. Suitable organic solvents include low molecular weight alcohols, esters, ketones and ethers. Particularly preferred are ethanol and propanol.

As defined herein, the phrase acid hydrolysis catalyst means either a strong mineral acid or a Lewis acid. Suitable strong mineral acids include $HNO_3$, $H_2SO_4$ and HCl. Suitable Lewis acid catalysts include transitional element catalysts, such as, zirconium or titanium or nontransitional elements, such as, aluminum. Generally, any catalytically effective amount of either the mineral acid or Lewis acid catalyst is acceptable.

Stage 12 of FIG. 1 illustrates the preparation of the dopant element compound which will subsequently be admixed with the siloxane oligomer solution. The dopant element compound acts as the source of dopant element which is eventually diffused into the semiconductor substrate wafer. As described above, the dopant element compound has the general formula $M_aZ_b$ comprises a Group III or Group V element in combination with a suitable counter ion. Preferred counter ions include chloride, iodide and bromide. Examples of preferred dopant element compounds include $AsCl_3$, $AsBr_3$, $AsI_3$, $AsOCl$, $AsOBr$, $AsOI$, $SbCl_3$, $SbBr_3$, $SbI_3$, $SbCl_5$, $SbBr_5$, $SbI_5$ and $SbOCl$.

As indicated above, the dopant element compound must be soluble in the selected anhydrous organic solvents. Accordingly, dopant element compounds which are not soluble in anhydrous organic solvents can be converted, by conventional methods, into organic solvent soluble forms of the Group III or Group V element selected. For example, antimony oxide which is organic solvent insoluble can be converted to the soluble chloride by reaction with concentrated hydrochloric acid.

Stage 14 illustrates the admixture of the siloxane oligomer prepared in Stage 10 with the dopant element compound prepared in Stage 12. The admixtures of the materials from Stages 10 and 12 result in a clear, homogeneous, stable oligomer-dopant element compound solution. The oligomer-dopant solution can be prepared by admixing the dopant element compound, in a suitable anhydrous organic solvent and subsequently admixing such solution with a previously prepared solution of the siloxane oligomer.

In the alternative, where no advance preparation of the dopant element compound is required, the dopant element compound may be added directly to the silicon tetra-alkoxide monomer in the presence of an anhydrous organic solvent, such mixture being subsequently admixed with a less than a stoichiometric amount of water and the selected acid hydrolysis catalyst. Such direct mixture of all components result in a solution which may be directly applied to the substrate wafer. Both the Stage 10 siloxane oligomer synthesis and the Stage 12 preparation of the dopant element compound in solution may occur at room temperature. The room temperature dissolution time is substantially longer than that at slightly elevated temperatures. Accordingly, some heat may be applied to the respective solutions to accelerate the dissolution of the various materials. Such room temperature or low temperature material preparation is a substantial advantage over the prior art.

In a preferred embodiment of the invention, the dopant element compound solution is admixed with a non-basic organic compound to react with halogen counter ions and remove such free counter ions from the solution by forming neutral halogenated compounds. Preferred non-basic organic compounds are organic epoxides. Such epoxides react with the halogen ions and form the corresponding neutral haloalcohols. Suitable epoxy compounds for use in the present process are ethylene oxide, propylene oxide, epichlorohydrin (i.e. 1-chloro-2,3-epoxypropane) and glycidol (i.e. 2,3-epoxy-1-propanol).

Particularly preferred is admixing propylene oxide with the dopant element compound. The propylene oxide is admixed with the dopant element compound to remove halide counter ion, particularly chloride counter ion, from the solution prior to primary heat treating. The following reaction equation illustrates the halide removal process:

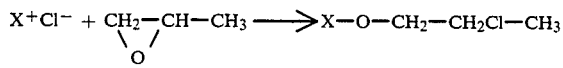

The presence of excess halide ion, particularly chloride, in the solution contributes to premature volatilization of dopant element, particularly arsenic chloride from the coating solution of oligomer and dopant element compound prior to the wafer reaching an effective doping temperature.

Stage 16 illustrates the application of the oligomer-dopant solution to the semiconductor wafer. Preferably, appropriately sized, for example 2 inch diameter silicon wafers, are rotated at relatively high RPMS, for example 2500 RPM, and sprayed with anhydrous isopropanol. The isopropanol wash removes surface contamination prior to the deposition of the oligomer-dopant solution. Subsequently the oligomer-dopant solution is placed on the wafer which is subsequently rotated rapidly for a short time to establish a thin film. The oligomer-dopant solution of the present invention has advantageous viscosity characteristics which cause the spin-coated silicon wafers to exhibit very uniform, thin coatings of the dopant laden solution.

After the coating process illustrated in Stage 16 is completed, in the preferred embodiment, an air drying Stage 18 is performed. The air drying removes residual organic solvent residues and places the coated substrate in proper condition for heat treating. The composite article which is resultant from Stage 14 or Stage 16 can be stored until needed or can be passed directly to a heat treatment stage.

Subsequent to the air drying Stage 18, a primary heat treatment, illustrated at Stage 20, is performed wherein the coated wafer is heated to a temperature of 300°–600° C. Such low temperature heat treatment converts the polyorganosiloxane-dopant compound coating into a uniform, thin film of glassy material, also in intimate composite contact with the underlying wafer. By practicing the process of the present invention, it is readily possible to produce high quality, uniform coatings of dopant laden glassy films on the wafer substrates on the order of 2000–3000 angstroms. While any suitable thickness may be selected, it has been discovered that 2000–3000 angstroms thickness is adequate to provide an acceptable dopant level in the final doped wafer product, as exemplified in the following Examples. The primary heat treatment process of Stage 20 can be conducted in any suitable oxygen containing atmosphere. Air is suitable for this purpose. Also, the atmospheres described for the secondary heat treatment, discussed hereinafter, contain sufficient oxygen for the primary heat treatment process.

Subsequent to the primary heat treating Stage 20, the composite glass-substrate wafer article may be stored until further processing is required or directly moved to Stage 22.

Stage 22 represents the secondary heat treatment step wherein the glass-wafer composite article produced in Stage 20 is heat treated at about 950°–1300° C. to produce an impurity doped semiconductor wafer material. The preferred temperature range for the doping done in the secondary heat treatment Stage 22 is about 950°–1250° C. Such preferred temperature range achieves minimum thermal damage to the wafers while it achieves suitable uniformity of doping.

The Stage 22 secondary heat treatment is carried out in a conventional high temperature furnace of 3 inch internal sample tube diameter, with a six inch long heating zone. The furnace has a constant flow gas system. For arsenic and antimony dopant sources an argon/oxygen gas mixture is preferred with 90% argon and 10% oxygen. However, gas mixtures of argon/oxygen from 80/20% to 95/5% may be used. When boron or phosphorus dopant sources are used a nitrogen/oxygen gas mixture is employed with a preferred gas mixture of 90% nitrogen and 10% oxygen.

The doped wafer material is next acid etched to remove the glassy residue at Stage 24 to produce an impurity doped semiconductor suitable for electronic applications. Any acid etching material may be used, hydrofluoric acid is suitable.

In practicing the process of the present invention an impurity doped semiconductor article is produced which has extremely uniform doping of either Group III or Group V element impurities. It has been discovered that the polyorganosiloxane-dopant element compound solutions employed in the present process are particularly well suited to the deposition of highly uniform dopant source layers on semiconductor substrate materials. Due to the fact that the alien dopant material is chemically homogeneous within the polyorganosiloxane material in the Stage 14 solution, it is uniformly distributed in the interstices of the siloxane polymer matrix. The dopant is accordingly uniformly distributed over the surface of the wafer. Such extremely uniform dopant layer production exhibits highly improved results over prior processes wherein dopant uniformity has been difficult to establish.

Additionally, all steps in the present process are carried out in the solution phase wherein the solutions are very stable. However, it should be noted that if excess amounts of water are admixed with the silicon tetra-alkoxide or the oligomer prior to admixture with the dopant source, the material may gel or produce a solid precipitate on standing. Such gels are more difficult to coat as a uniform film on the wafers and are not preferred. Such gel or precipitate formation may be conveniently avoided by restricting the access of atmospheric water to the solutions by the simple expedient of a drying tube attached to any container holding the solutions, prior to coating as at Stage 16. As coating occurs, atmospheric water aids in the gelling of the oligomer fraction of the polyorganosiloxane-dopant compound solution by providing water as a reactant in equations 1(a.) and 1(c.) above. Such post-coating gelling does not adversely affect the heat treatment phase of the present process, in fact, such atmospheric moisture is useful in accelerating the formation of a stable coating.

The present invention produces an impurity doped semiconductor substrate material without the necessity of resorting to high temperature technology which can produce carbonaceous residues which adversely effect uniform dopant deposition and diffusion into the substrate wafer. Also, it has been discovered that the limited polymerization of the silicon tetra-alkoxide monomer to form the oligomer militates against the premature volatilization of the silicon tetra-alkoxide monomer during the primary heat treatment Stage 20.

The present process is advantageous in that it provides for highly uniform doping of impurities into semiconductor substrates. Also advantageous is the avoidance of carbonaceous residue buildup during the secondary heat treatment, or doping, of Stage 22. Further, all preliminary solutions, such as those at Stage 10 and 12, may be prepared at room temperature or slightly elevated temperatures (to accelerate dissolution of components) but do not use high temperature technology which can produce carbonaceous residues which adversely effect uniform doping.

The following Examples are illustrative of the process of the present invention.

EXAMPLE I

Part A

Direct Preparation of Polyorganosiloxane—Dopant Compound Solution

Four grams of antimony oxide ($Sb_2O_3$) is added to 12 grams of concentrated HCl, to convert the oxide to an organic solvent soluble chloride, and warmed until a clear solution is obtained. Then, 2 grams of water, 100 grams of isopropanol and 55.5 grams of tetraethylsilicate are added. The resulting solution is refluxed for one hour and cooled to room temperature. Sufficient isopropanol is added to bring the solution to a total weight of 190 grams. Next, to bring the solution to a neutral pH, 2 gram aliquots of propylene oxide are added. About 12 grams are required. The propylene oxide is added to remove chloride ion from the solution according to the following equation:

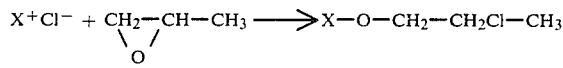

The presence of excess chloride ion in the solution contributes to premature volatilization of arsenic chloride (the arsenic source) from the coating solution prior to the temperature of PART B where doping begins.

This solution corresponds to a total oxide concentration of 10% including 20% antimony oxide and 80% silica.

Part B

Coating and Doping Procedure

A two inch diameter silicon wafer, as purchased, is spun at 2,500 RPM's and sprayed with anhydrous isopropanol to remove surface contaminants, like dust. Next, a 0.5–0.7 gram of the polyorganosiloxane-dopant element compound solution of PART A is coated onto the wafer surface. The wafer is spun at 2,500 RPM's for about 15 seconds. The resulting wafer is coated with a thin, uniform layer of solution. The coated wafer is air dried for about 15 minutes to remove solvent.

After drying, the wafer is heated in a combined primary-secondary heat treating step to between 1000°–1250° C. for at least 15 minutes as described in the results of Table I, below. The wafers are heated in a conventional high temperature furnace of 3 inch internal sample tube diameter with a six inch long heating zone. The furnace includes a constant flow gas system. The furnace is filled with a flowing stream of 90% argon-10% oxygen gas mixture at a flow rate of one liter per minute argon and 0.1 liter per minute oxygen gas.

After firing, the residual glassy film is removed by acid etching with $2\frac{1}{2}\%$ HF (formed from 5 grams, 48% concentrated HF in 95 grams water) for about 20 minutes. The wafer is rinsed in water, dried and resistance tested to establish uniformity of doping, as indicated in Table I, below.

Part C

Results For 20% antimony oxide and 80% silica wafers produced in accordance with PARTS A–B above, the following uniform resistance measurements established very uniform doping when wafers are prepared according to the present process.

TABLE I

| Heat Treatment | | Resistance (Ohms/Square) | | | |
|---|---|---|---|---|---|
| Time | Temp. | High | Low | Avg. | No. of Samples |
| 4 hrs. | 1150° C. | 63.2 | 49.2 | 54.2 | 3 |
| 2 hrs. | " | 48.9 | 41.5 | 44.9 | 3 |
| 1 hr. | " | 90.1 | 72.9 | 81.7 | 3 |
| ½ hr. | " | 365.0 | 278.0 | 314.3 | 3 |

TABLE I-continued

| Heat Treatment | | Resistance (Ohms/Square) | | | |
|---|---|---|---|---|---|
| Time | Temp. | High | Low | Avg. | No. of Samples |
| 4 hrs. | 1200° C. | 16.6 | 16.4 | 16.5 | 3 |
| 2 hrs. | " | 28.9 | 25.5 | 27.0 | 3 |
| 1 hr. | " | 47.5 | 40.2 | 43.4 | 3 |
| ½ hr. | " | 89.6 | 77.5 | 83.3 | 3 |
| 4 hrs. | 1150° C. | 40.1 | 32.3 | 34.8 | 12 |

EXAMPLE II

Part A

Direct Preparation of Polyorganosiloxane-Dopant Compound Solution

About 6.26 grams of antimony trichloride ($SbCl_3$) is added to 60 grams of isopropanol, 1 gram of concentrated HCl, 9.0 grams of water and 55.5 grams of tetraethylsilicate. The resulting solution is refluxed for 15 minutes and cooled to room temperature. Sufficient isopropanol is added to bring the solution to a total weight of 190 grams. Next, to bring the solution to a neutral pH, 2 gram aliquots of propylene oxide are added. About 12 grams are required.

This solution corresponds to a total oxide concentration of 10% including 20% antimony oxide and 80% silica.

Part B

Coating and Doping Procedure

The Coating and Doping Procedure used in this Example is the same procedure used in PART B of Example I.

Part C

Results

For 20% antimony oxide and 80% silica wafers produced in accordance with PARTS A–B above, the following uniform resistance measurements established very uniform doping when wafers are prepared according to the present process.

TABLE II

| Heat Treatment | | Resistance (Ohms/Square) | | | |
|---|---|---|---|---|---|
| Time | Temp. | High | Low | Avg. | No. of Samples |
| 4 hrs. | 1250° C. | 9.7 | 9.3 | 9.5 | 6 |
| 2 hrs. | " | 13.4 | 12.8 | 13.2 | 6 |
| 1 hr. | " | 22.0 | 21.1 | 21.5 | 6 |
| ½ hr. | " | 37.1 | 34.3 | 35.5 | 6 |
| 4 hrs. | 1200° C. | 13.4 | 13.1 | 13.3 | 6 |
| 2 hrs. | " | 21.2 | 20.6 | 20.8 | 6 |
| 1 hr. | " | 34.4 | 32.3 | 33.8 | 6 |
| ½ hr. | " | 63.8 | 59.0 | 60.9 | 6 |
| 4 hrs. | 1150° C. | 27.6 | 26.5 | 27.0 | 6 |
| 2 hrs. | " | 45.4 | 41.7 | 43.9 | 6 |
| 1 hr. | " | 79.6 | 76.5 | 78.6 | 5 |
| ½ hr. | " | 172.7 | 158.3 | 164.4 | 6 |
| 4 hrs. | 1100° C. | 99.7 | 90.1 | 93.6 | 6 |
| 2 hrs. | " | 161.1 | 151.3 | 156.8 | 6 |

EXAMPLE III

Part A

Direct Preparation of Polyorganosiloxane-Dopant Compound Solution

Two grams of arsenic oxide ($As_2O_3$) is added to 7 grams of concentrated HCl, to convert the oxide to a soluble chloride, and warmed until a clear solution is obtained. Then, 9 grams of water, 100 grams of isopropanol and 62.4 grams of tetraethylsilicate are added. The resulting solution is refluxed for 1.5 hours and cooled to room temperature. Sufficient isopropanol is added to bring the solution to a total weight of 190 grams. Next, to bring the solution to a neutral pH, 2 gram aliquots of propylene oxide are added. About 10 grams are required.

This solution corresponds to a total oxide concentration of 10% including 10% arsenic oxide and 90% silica.

Part B

Coating and Doping Procedure

The Coating and Doping Procedure used in this Example is the same procedure used in PART B of Example I.

Part C

Results

For 10% arsenic oxide and 90% silica wafers produced in accordance with PARTS A–B above, the following uniform resistance measurements established very uniform doping when wafers are prepared according to the present process.

TABLE III

| Heat Treatment | | Resistance (Ohms/Square) | | | |
|---|---|---|---|---|---|
| Time | Temp. | High | Low | Avg. | No. of Samples |
| 4 hrs. | 1200° C. | 11.7 | 11.0 | 11.4 | 3 |
| 2 hrs. | " | 14.9 | 14.0 | 14.4 | 3 |
| 1 hr. | " | 21.6 | 19.5 | 20.4 | 3 |
| ½ hr. | " | 55.7 | 36.0 | 48.0 | 3 |
| ¼ hr. | " | 134.2 | 117.8 | 125.3 | 3 |
| 4 hrs. | 1100° C. | 34.2 | 32.8 | 33.6 | 3 |
| 2 hrs. | " | 34.9 | 34.2 | 34.6 | 3 |
| 1 hr. | " | 84.4 | 75.6 | 80.9 | 3 |
| ½ hr. | " | 185.6 | 178.5 | 182.0 | 3 |
| ¼ hr. | " | 345.9 | 318.1 | 329.4 | 3 |

EXAMPLE IV

Part A

Direct Preparation of Polyorganosiloxane-Dopant Compound Solution

Four grams of arsenic trioxide ($As_2O_3$) is added to 14 grams of concentrated HCl, to convert the oxide to a soluble chloride, and warmed until a clear solution is obtained. Next, 100 milliliters of anhydrous isopropanol and 33 grams of hydrolyzed ethylsilicate (equivalent to 16 grams of silica) described below are added.

The hydrolyzed ethylsilicate is prepared by adding 44 grams of water and 10 grams of 1N nitric acid to 208 grams of tetraethylsilicate. The mixture is stirred vigorously at room temperature. An exothermic reaction occurs and a homogeneous, clear solution results. Next, 416 grams of tetraethylsilicate and 18 grams of water are added to the homogeneous, clear solution and the solution is refluxed for 2 hours. The solution is then cooled to room temperature and the ethanol by-product is evaporated off under vacuum. The resulting slightly viscous liquid is heated under vacuum at 60° C. until no more volatile material is liberated. The product is hydrolyzed ethyl silicate and is about 365 grams in mass, and contains the equivalent of 49% $SiO_2$.

The polyorganosiloxane-dopant compound solution prepared above corresponds to a total oxide concentration of 10% including 20% arsenic oxide and 80% silica.

Part B

Coating and Doping Procedure

The Coating and Doping Procedure used in this Example is the same procedure used in PART B of Example I.

Part C

Results

For 20% arsenic oxide and 80% silica wafers produced in accordance with PARTS A-B above, the following uniform resistance measurements established very uniform doping when wafers are prepared in accordance with the present process.

TABLE IV

| Heat Treatment | | Resistance (Ohms/Square) | No. of Samples |
|---|---|---|---|
| Time | Temp. | | |
| 2 hrs. | 1150° C. | 41.7 | 1 |
| 4 hrs. | " | 33.1 | 1 |

EXAMPLE V

Part A

Direct Preparation of Polyorganosiloxane-Dopant Compound Solution

Six and twenty-six hundredths of a gram of antimony trichloride ($SbCl_3$) is added to 60 grams of isopropanol, 1 gram of concentrated HCl, 9.0 grams of water and 55.5 grams of tetraethylsilicate. The resulting solution is refluxed for 15 minutes and cooled to room temperature. Sufficient isopropanol is added to bring the solution to a total weight of 190 grams. Next, to bring the solution to a neutral pH, 2 gram aliquots of propylene oxide are added. About 12 grams are required.

This solution corresponds to a total oxide concentration of 10% including 20% antimony oxide and 80% silica.

Part B

Coating and Doping Procedure

The Coating and Doping Procedure used in this Example is the same procedure used in PART B of Example I.

Part C

Results

For 20% antimony oxide and 80% silica wafers produced in accordance with PARTS A-B above, the following uniform resistance measurements established very uniform doping when wafers are prepared according to the present process.

TABLE V

| Heat Treatment | | Resistance (Ohms/Square) | | | No. of Samples |
|---|---|---|---|---|---|
| Time | Temp. | High | Low | Avg. | |
| 4 hrs. | 1150° C. | 32.1 | 28.6 | 30.6 | 3 |
| 2 hrs. | " | 58.3 | 43.5 | 50.3 | 3 |
| 1 hr. | " | 109.5 | 95.9 | 102.7 | 2 |
| ½ hr. | " | 173.6 | 131.8 | 151.7 | 3 |
| ¼ hr. | " | 251.1 | 239.9 | 245.5 | 2 |
| 4 hrs. | 1200° C. | 16.4 | 15.4 | 15.9 | 3 |
| 2 hrs. | " | 22.4 | 21.7 | 22.1 | 3 |

TABLE V-continued

| Heat Treatment | | Resistance (Ohms/Square) | | | No. of Samples |
|---|---|---|---|---|---|
| Time | Temp. | High | Low | Avg. | |
| 1 hr. | " | 43.0 | 35.5 | 38.3 | 3 |
| ½ hr. | " | 82.0 | 58.7 | 71.8 | 3 |
| ¼ hr. | " | 118.2 | 100.4 | 106.6 | 3 |

EXAMPLE VI

Part A

Direct Preparation of Polyorganosiloxane-Dopant Compound Solution

Four grams of antimony oxide ($Sb_2O_3$) is added to 14 grams of concentrated HCl, to convert the oxide to a soluble chloride and warmed until a clear solution is obtained. Then, 100 grams of isopropanol and 55.5 grams of tetraethylsilicate are added. The resulting solution is refluxed for a short time and cooled to room temperature. Sufficient isopropanol is added to bring the solution to a total weight of 200 grams.

This solution corresponds to a total oxide concentration of 10% including 20% antimony oxide and 80% silica.

Part B

Coating and Doping Procedure

The Coating and Doping Procedure used in this Example is the same procedure used in PART B of Example I.

Part C

Results

For 20% antimony oxide and 80% silica wafers produced in accordance with PARTS A-B above, the following uniform resistance measurements established very uniform doping when wafers are prepared according to the present process.

TABLE VI

| Heat Treatment | | Resistance (Ohms/Square) | | | No. of Samples |
|---|---|---|---|---|---|
| Time | Temp. | High | Low | Avg. | |
| 4 hrs. | 1100° C. | 28.4 | 16.7 | 21.9 | 9 |
| 2 hrs. | " | 33.6 | 22.1 | 26.8 | 9 |
| 1 hr. | " | 61.4 | 39.0 | 48.1 | 9 |
| ½ hr. | " | 150.4 | 54.6 | 87.7 | 9 |
| ¼ hr. | " | 277.9 | 187.1 | 238.3 | 6 |

EXAMPLE VII

Part A

Direct Preparation of Polyorganosiloxane-Dopant Compound Solution

Four grams of arsenic oxide ($As_2O_3$) is dissolved in 12.5 grams of concentrated HCl and 1.6 grams of distilled deionized water by heating gently with stirring. Next, 100 grams of dry isopropanol followed by 55.5 grams of tetraethylsilicate are added and the solution refluxed for one hour. Sufficient dry isopropanol is added to bring the total solution weight to 200 grams.

This solution corresponds to an oxide concentration of 10% including 80% $SiO_2$ and 20% $As_2O_3$.

The solution volume is divided into two equal halves. To a first half of the solution is added propylene oxide in 1 gram aliquots until the solution is neutral in pH, requiring approximately 5 grams of propylene oxide.

Part B

Coating and Doping Procedure

The Coating and Doping Procedure used in this Example is the same procedure used in PART B of Example I.

Part C

Results

For 20% arsenic oxide ($As_2O_3$) and 80% silica ($SiO_2$) wafers produced in accordance with PARTS A-B above, the following uniform resistance measurements established very uniform doping when wafers are prepared according to the present process.

TABLE VII-A

| Wafers Prepared Without Propylene Oxide Addition | | | |
|---|---|---|---|
| Heat Treatment | | Measured Resistances (Ohms/Square) | |
| Time | Temp. | Average | No. of Samples |
| 4 hrs. | 1150° C. | 143 | 1 |
| " | " | 137 | 1 |
| " | " | 122 | 1 |
| " | " | 126 | 1 |
| " | " | 115 | 1 |
| " | " | 119 | 1 |

Each of the average Measured Resistances reported above VII-A are an average number determined by taking five different measurements at five different points on the surface of the subject wafer.

TABLE VII-B

| Wafers Prepared With Propylene Oxide Addition | | | |
|---|---|---|---|
| Heat Treatment | | Measured Resistances (Ohms/Square) | |
| Time | Temp. | Average | No. of Samples |
| 4 hrs. | 1150° C. | 18.1 | 1 |
| " | " | 13.2 | 1 |
| " | " | 16.2 | 1 |
| " | " | 18.5 | 1 |
| " | " | 15.9 | 1 |
| " | " | 18.2 | 1 |

Each of the above Measured Resistances reported above in VII-B are an average number determined by taking five different measurements at five different points on the surface of the subject wafer. The above results show that for identically treated wafers, the addition of propylene oxide to the coating solution prepared as in PART A, produces superior wafers showing substantially better resistance numbers.

EXAMPLE VIII

Part A

Direct Preparation of Polyorganosiloxane-Dopant Compound Solution Four grams of antimony oxide ($Sb_2O_3$) is dissolved in 12.0 grams of concentrated HCl and 1.9 grams of distilled deionized water by heating gently with stirring. Next, 100 grams of dry isopropanol followed by 55.5 grams of tetraethylsilicate are added and the solution refluxed for one hour. Sufficient dry isopropanol is added to bring the total solution weight to 200 grams.

This solution corresponds to an oxide concentration of 10% including 80% $SiO_2$ and 20% $Sb_2O_3$.

The solution volume is divided into two equal halves. To a first half of the solution is added propylene oxide in 1 gram aliquots until the solution is neutral in pH, requiring approximately 5 grams of propylene oxide.

Part B

Coating and Doping Procedure

The Coating and Doping Procedure used in this Example is the same procedure used in PART B of Example I.

Part C

Results

For 20% antimony oxide ($Sb_2O_3$) and 80% silica ($SiO_2$) wafers produced in accordance with PARTS A-B above, the following uniform resistance measurements established very uniform doping when wafers are prepared according to the present process.

TABLE VIII-A

| Wafers Prepared Without Propylene Oxide Addition | | | |
|---|---|---|---|
| Heat Treatment | | Measured Resistances (Ohms/Square) | |
| Time | Temp. | Average | No. of Samples |
| 4 hrs. | 1150° C. | 32.6 | 1 |
| " | " | 29.4 | 1 |
| " | " | 32.2 | 1 |
| " | " | 31.8 | 1 |
| " | " | 28.5 | 1 |
| " | " | 28.7 | 1 |

Each of the average Measured Resistances reported above in VIII-A are an average number determined by taking five different measurements at five different points on the surface of the subject wafer.

TABLE VIII-B

| Wafers Prepared With Propylene Oxide Addition | | | |
|---|---|---|---|
| Heat Treatment | | Measured Resistances (Ohms/Square) | |
| Time | Temp. | Average | No. of Samples |
| 4 hrs. | 1150° C. | 20.0 | 1 |
| " | " | 19.5 | 1 |
| " | " | 21.1 | 1 |
| " | " | 18.3 | 1 |
| " | " | 15.8 | 1 |
| " | " | 17.2 | 1 |

Each of the above Measured Resistances reported above in VII-B are an average number determined by taking five different measurements at five different points on the surface of the subject wafer. The above results show that for identically treated wafers, the addition of propylene oxide to the coating solution prepared as in PART A, produces superior wafers showing substantially better resistance numbers.

We claim:

1. A semiconductor article having a semiconductor substrate with a dopant element solid state diffused therein from a doping composition layer deposited therein, the layer being heated to form a glassy state and fired to diffuse the dopant element into the substrate and form an $SiO_2$ layer thereon. the layer being formed by coating the substrate with a doping composition solution comprising
    (A) a dopant element compound comprising a reactive dopant source compound in which the dopant is boron or a Group VB element, (B) a solvent soluble further curable liquid low molecular weight organopolysiloxane that is a reaction product of a silicon alkoxide and water in which the amount of water is less than stoichiometric, (C) an organic epoxide to provide the solution with a neutral pH, and (D) an organic solvent for (A), (B) and (C).

2. A composite semiconductor article comprising:

a first layer of a semiconductor substrate material having a dopant diffused therein, and a second layer that is coated over the first layer having a dopant element compound for solid state diffusion into the substrate material, the dopant element compound having the formula $M_a Z_b$ where M is boron or a Group III or Group VB element, where a and b are integers, and Z is a compound forming ion which combines with M to provide a compound that is soluble in an organic solvent and forms a glass forming oxide on heating, the dopant element being uniformly dispersed in the interstices of a solvent soluble, further curable organopolysiloxane, the second layer being deposited on the substrate, heated to a glassy state, and heated to form a $SiO_2$ layer and diffuse the dopant element into the substrate, the second layer being deposited from a doping composition solution of the dopant element compound in a solvent along with the solvent soluble organopolysiloxane and an epoxide added to bring the solution to a neutral pH.

3. A semiconductor article having a semiconductor substrate with a dopant element solid state diffused therein from a doping composition that is deposited thereon, heated to form a glassy layer and fired to provide an $SiO_2$ layer, the doping element composition comprising a solution in an organic solvent of (A) a dopant element compound that is a boron halide or a Group VB element halide, (B) a solvent soluble, low molecular weight, thermosettable organopolysiloxane, and (C) an organic epoxide in an amount sufficient to provide the solution with a neutral pH.

4. A doping composition as defined in claim 3 in which the doping element is arsenic.

5. A doping composition as defined in claim 3 in which the doping element is antimony and the solvent soluble organopolysiloxane is prepared by reacting a silicon tetraalkoxide with water in which the molar ratio of water to alkoxide is about 2/1 to 1/1.

6. A doping composition as defined in claim 3 in which the doping element compound is arsenic oxychloride formed by reacting arsenic trioxide and HCl, the organic epoxide is propylene oxide that neutralizes the acid, and the organopolysiloxane is hydrolyzed ethylsilicate.

7. A doping composition as defined in claim 2 in which the dopant element compound is antimony halide.

8. A doping composition as defined in 2 in which the dopant element compound is arsenic halide.

9. A doping composition as defined in claim 2 in which the dopant element compound is arsenic oxychloride.

10. A doping composition as defined in claim 2 in which the organic epoxide is propylene oxide.

* * * * *